United States Patent
Adam et al.

(10) Patent No.: US 8,975,125 B2
(45) Date of Patent: Mar. 10, 2015

(54) FORMATION OF BULK SIGE FIN WITH DIELECTRIC ISOLATION BY ANODIZATION

(71) Applicant: International Business Machines Corporation, Armonk, NY (US)

(72) Inventors: Thomas N. Adam, Slingerlands, NY (US); Kangguo Cheng, Schenectady, NY (US); Bruce B. Doris, Brewster, NY (US); Pouya Hashemi, White Plains, NY (US); Ali Khakifirooz, Mountain View, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/803,491

(22) Filed: Mar. 14, 2013

(65) Prior Publication Data

US 2014/0264594 A1    Sep. 18, 2014

(51) Int. Cl.
*H01L 29/78* (2006.01)
*H01L 29/66* (2006.01)

(52) U.S. Cl.
CPC ........ *H01L 29/785* (2013.01); *H01L 29/66477* (2013.01); *H01L 29/66795* (2013.01)
USPC .......................................... 438/151; 257/347

(58) Field of Classification Search
USPC .......................................... 257/347; 438/151
See application file for complete search history.

(56) References Cited

U.S. PATENT DOCUMENTS

| | | | |
|---|---|---|---|
| 6,214,701 B1 | 4/2001 | Matsushita et al. | |
| 6,881,650 B2 | 4/2005 | Lee et al. | |
| 7,172,930 B2 * | 2/2007 | Adam et al. | 438/150 |
| 7,288,802 B2 | 10/2007 | Anderson et al. | |
| 7,498,602 B2 | 3/2009 | Zhu et al. | |
| 7,800,152 B2 * | 9/2010 | Zhu et al. | 257/302 |
| 8,048,723 B2 | 11/2011 | Chang et al. | |
| 8,367,498 B2 * | 2/2013 | Chang et al. | 438/268 |
| 8,486,770 B1 | 7/2013 | Wu et al. | |
| 8,703,556 B2 | 4/2014 | Kelly et al. | |
| 2006/0292772 A1 | 12/2006 | Anderson et al. | |
| 2007/0082437 A1 * | 4/2007 | Cheng et al. | 438/197 |

(Continued)

OTHER PUBLICATIONS

Office Action dated Mar. 18, 2014 received in related U.S. Appl. No. 14/029,198.

(Continued)

*Primary Examiner* — Jarrett Stark
*Assistant Examiner* — Charles N Ausar-El
(74) *Attorney, Agent, or Firm* — Scully, Scott, Murphy & Presser, P.C.; Louis J. Percello, Esq.

(57) ABSTRACT

A method of fabricating a semiconductor device is provided that includes providing a material stack that includes a silicon layer, a doped semiconductor layer, and an undoped silicon germanium layer. At least one fin structure is formed from the material stack by etching through the undoped silicon germanium layer, the doped semiconductor layer, and etching a portion of the silicon-containing layer. An isolation region is formed in contact with at least one end of the at least one fin structure. An anodization process removes the doped semiconductor layer of the at least one fin structure to provide a void. A dielectric layer is deposited to fill the void that is present between the silicon layer and the doped semiconductor layer. Source and drain regions are then formed on a channel portion of the at least one fin structure.

16 Claims, 7 Drawing Sheets

(56) References Cited

U.S. PATENT DOCUMENTS

| | | |
|---|---|---|
| 2008/0050897 A1 | 2/2008 | Kottantharayil |
| 2008/0277690 A1 | 11/2008 | Adam et al. |
| 2010/0038679 A1 | 2/2010 | Chan et al. |
| 2010/0144121 A1 | 6/2010 | Chang et al. |
| 2010/0276662 A1 | 11/2010 | Colinge |
| 2011/0049613 A1 | 3/2011 | Yeh et al. |
| 2011/0097889 A1 | 4/2011 | Yuan et al. |
| 2011/0147811 A1 | 6/2011 | Kavalieros et al. |
| 2012/0193751 A1* | 8/2012 | Kawasaki et al. ............ 257/506 |
| 2012/0205716 A1 | 8/2012 | Adam et al. |
| 2012/0276695 A1* | 11/2012 | Cheng et al. ................ 438/154 |
| 2012/0306002 A1 | 12/2012 | Yeh et al. |
| 2013/0140637 A1 | 6/2013 | Chang et al. |
| 2013/0196478 A1 | 8/2013 | Chang et al. |
| 2013/0270638 A1 | 10/2013 | Adam et al. |
| 2014/0061820 A1* | 3/2014 | Reznicek et al. ............ 257/401 |

OTHER PUBLICATIONS

Office Action dated Sep. 30, 2014 received in U.S. Appl. No. 14/029,198.

\* cited by examiner

FORMATION OF BULK SIGE FIN WITH DIELECTRIC ISOLATION BY ANODIZATION

BACKGROUND

The present disclosure relates generally to semiconductor devices. More particularly, the present disclosure relates to semiconductor devices having a fin structure.

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties. In view of the possibility of scaling reaching its limits, other semiconductor geometries, such as fin field effect transistors (finFETs) have been considered.

SUMMARY

A method of fabricating a semiconductor device is provided that includes providing a material stack that includes a silicon layer, a doped semiconductor layer that is present on a surface of the silicon layer, and an undoped silicon germanium layer that is present on the doped semiconductor layer. At least one fin structure is formed from the material stack by etching through the undoped silicon germanium layer, the doped semiconductor layer, and etching a portion of the silicon-containing layer. A support structure is formed in contact with at least one end of the at least one fin structure. An anodization process removes the doped semiconductor layer of the at least one fin structure to provide a void between the silicon layer and the undoped silicon germanium layer. A dielectric layer is deposited to fill the void that is present between the silicon layer and the undoped silicon germanium layer. Source and drain regions are then formed on a channel portion of the at least one fin structure.

Another method of fabricating a semiconductor device is provided that includes forming a first material stack and a second material stack on a substrate. The first material stack includes a doped semiconductor layer that is present on the substrate and a silicon layer that is present on the doped semiconductor layer. The second material stack includes the doped semiconductor layer that is present on the substrate and a silicon germanium layer that is present on the doped semiconductor layer. Fin structures are formed from the first material stack and the second material stack with an etch through the silicon layer and the silicon germanium layer that terminates on the doped semiconductor layer. A supporting structure is then formed on at least one end of each fin structure. The doped semiconductor layer is then removed to provide a void between the substrate and the silicon layer and the substrate and the silicon germanium layer. A dielectric layer is deposited to fill the void that is present between the silicon layer and the substrate, and the void between the silicon germanium layer and the substrate. Source and drain regions are then formed on a channel portion of the fin structures, wherein the source and drain regions to the fin structures including the silicon germanium layer have a p-type conductivity and the source and drain regions to the fin structures having the silicon layer have an n-type conductivity.

In another aspect, a semiconductor device is provided. In one embodiment, the semiconductor device includes a silicon germanium (SiGe) fin structure on a dielectric layer that is present on bulk substrate. Source regions and drain regions having a p-type conductivity in direct contact with a channel portion of the silicon germanium (SiGe) fin structure.

DESCRIPTION OF SEVERAL VIEWS OF THE DRAWINGS

The following detailed description, given by way of example and not intended to limit the present disclosure solely thereto, will best be appreciated in conjunction with the accompanying drawings, wherein like reference numerals denote like elements and parts, in which.

DETAILED DESCRIPTION

Detailed embodiments of the methods and structures of the present disclosure are described herein; however, it is to be understood that the disclosed embodiments are merely illustrative of the disclosed methods and structures that may be embodied in various forms. In addition, each of the examples given in connection with the various embodiments of the disclosure are intended to be illustrative, and not restrictive. References in the specification to "one embodiment", "an embodiment", "an example embodiment", etc., indicate that the embodiment described may include a particular feature, structure, or characteristic, but every embodiment may not necessarily include the particular feature, structure, or characteristic.

Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For the purposes of the description hereinafter, the terms "upper", "lower", "top", "bottom", and derivatives thereof shall relate to the disclosed structures, as they are oriented in the drawing figures.

The methods and structures disclosed herein provide fin structures. In some examples of fin containing semiconductor devices, such as finFETs, it is desirable to have the bulk fin isolated from the bulk substrate. By isolating the bulk fin from the bulk substrate with a dielectric the leakage current may be minimized. One approach to make dielectric isolated bulk finFETs is to form a silicon (Si) fin on a sacrificial silicon germanium (SiGe) structure. However, it has been discovered that such an approach can not be used to form dielectric isolated silicon germanium (SiGe) fin structures, or germanium (Ge) fin structures, due to the lack of etch selectively between the sacrificial silicon germanium (SiGe) and the silicon germanium (SiGe) that provides the fin structures. Performance enhancements for p-type fin field effect transistors (p-type finFETs) may be provided by silicon germanium (SiGe) fins with dielectric isolation.

FIGS. 1-6D depict one embodiment of a method of fabricating a semiconductor device including at least one fin structure 5, in which the at least one fin structure 5 is composed of silicon germanium (SiGe) and is in direct contact with a dielectric surface, i.e., dielectric layer 13. The term "direct contact" means that a first element, such as a first structure, and a second element, such as a second structure, are connected without any intermediary conducting, insulating or semiconductor layers at the interface of the two elements.

Figure 1:
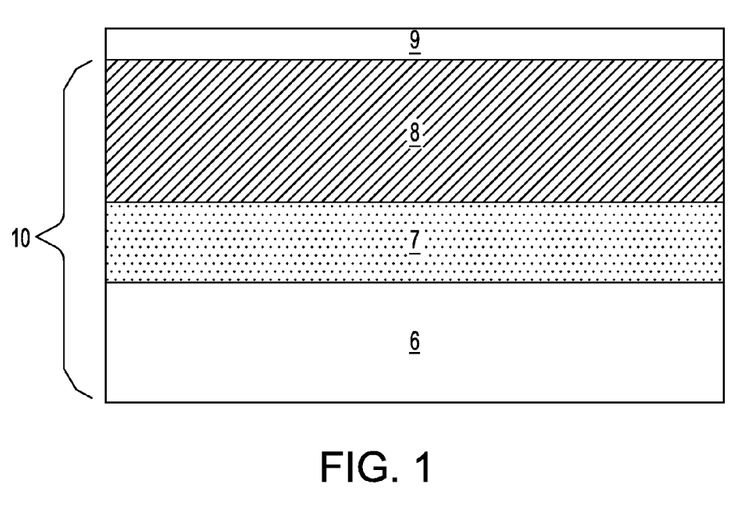
FIG. 1 is a side cross-sectional view of a material stack of an undoped silicon germanium layer, a doped semiconductor layer, and a silicon layer, in accordance with one embodiment of the present disclosure.

FIG. 1 depicts one embodiment of a material stack 10 that includes an undoped silicon germanium layer 8, a doped semiconductor layer 7, and a semiconductor layer 6. In one embodiment, the semiconductor layer 6 may be provided by a bulk substrate. The semiconductor layer 6 may comprise at least one of Si, Ge, SiGe, GaAs, InAs, InP, SiCGe, SiC as well as other III/V or II/VI compound semiconductors and alloys thereof. In one example, the semiconductor layer 6 is composed of a silicon containing material, such as silicon (Si). In one example, the semiconductor layer 6 is monocrystalline.

The doped semiconductor layer 7 may be present on, e.g., in direct contact with, the semiconductor layer 6. In some embodiments, the doped semiconductor layer 7 may be composed of silicon germanium (SiGe). The doped semiconductor layer 7 may be composed of up to 99 wt. % germanium. In one embodiment, the doped semiconductor layer 7 is a doped silicon germanium (SiGe) layer and comprises from 1 wt. % germanium to 99 wt. % germanium. In another embodiment, the doped semiconductor layer 7 is composed of 10 wt. % to 50 wt. % germanium. The doped semiconductor layer 7 may be a single layer having a continuous distribution of germanium, or it may be a graded layer having a varying content of germanium included within different regions of the layer. The thickness of the doped semiconductor layer 7 may range from 5 nm to 5000 nm. In another embodiment, the doped semiconductor layer 7 may have a thickness that ranges from 20 nm to 200 nm.

In one embodiment, the doped semiconductor layer 7 is an "epitaxial" layer that has been deposited by an epitaxial growth and/or deposition method. A semiconductor material that is referred to as being "epitaxial" is a semiconductor material that is formed using epitaxial growth and/or deposition. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon oxide or silicon nitride surfaces.

A number of different sources may be used for the deposition of epitaxial silicon germanium. In some embodiments, the gas source for the deposition of epitaxial silicon germanium may include a mixture of silicon containing gas sources and germanium containing gas sources. For example, an epitaxial layer of silicon germanium may be deposited from the combination of a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and a germanium gas source that is selected from the group consisting of germane, digermane, halogermane, dichlorogermane, trichlorogermane, tetrachlorogermane and combinations thereof.

In one embodiment, the doped semiconductor layer 7 is composed of germanium, e.g., 100 wt % germanium. A number of different sources may be used for the deposition of epitaxial germanium. In some embodiments, the germanium containing gas sources for epitaxial growth include germane ($GeH_4$), digermane ($Ge_2H_6$), halogermane, dichlorogermane, trichlorogermane, tetrachlorogermane and combinations thereof.

Examples of various epitaxial growth process apparatuses that are suitable for use with the present disclosure include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the doped semiconductor layer 7 typically ranges from 550° C. to 900° C. Although higher temperature typically results in faster deposition, the faster deposition may result in crystal defects and film cracking.

The term "doped" as used herein to describe the doped semiconductor layer 7 means that a dopant is present within the doped semiconductor layer 7 to increase the selectivity of removal of the doped semiconductor layer 7 with a later described anodization process in comparison to the undoped silicon germanium layer 8 and the semiconductor layer 6. In one embodiment, the dopant that is present in the doped semiconductor layer 7 may include at least one of boron (B), indium (In), and a combination thereof. The dopant that is present in the doped semiconductor layer 7 that provides for selective removal by anodization may be present within the doped semiconductor layer 7 in a concentration ranging from $1 \times 10^{17}$ atoms/cm$^3$ to $5 \times 10^{20}$ atoms/cm$^3$. In another example, the dopant that is present in the doped semiconductor layer 7 that provides for selective removal by anodization may be present within the doped semiconductor layer 7 in a concentration ranging from $5 \times 10^{17}$ atoms/cm$^3$ to $5 \times 10^{19}$ atoms/cm$^3$. In yet another example, the dopant that is present in the doped semiconductor layer 7 that provides for selective removal by anodization may be present within the doped semiconductor layer 7 in a concentration ranging from $1 \times 10^{18}$ atoms/cm$^3$ to $1 \times 10^{19}$ atoms/cm$^3$.

The dopant that is present in the doped semiconductor layer 7 that provides for selective removal by anodization may be introduced using an in-situ doping process or using ion implantation. By "in-situ" it is meant that the dopant that provides the conductivity type of the material layer is introduced as the material layer is being formed or deposited, e.g., during the epitaxial deposition process. For example, when doping the doped semiconductor material concurrently with the epitaxial growth process, a gas source for the dopant is introduced to the semiconductor material being grown simultaneously with the gas source that provides the precursor for epitaxially forming the semiconductor material. In-situ doping is differentiated from ion implantation that occurs after the semiconductor material has been formed. In one example, in which the dopant that is present in the doped semiconductor layer 7 includes boron (B), the gaseous dopant sources for in-situ doping include $B_2H_6$, $BCl_3$ and combinations thereof. In other embodiments, the dopant that is present in the doped semiconductor layer 7 that provides for selective removal by anodization may be introduced using ion implantation after the base material layer, i.e., epitaxial silicon germanium layer, for the doped semiconductor layer 7 has been formed. In yet other embodiments, the dopant may be introduced by gas phase doping, or by depositing a doped layer and defusing the dopant from the doped layer to the silicon germanium.

In some embodiments, a localized anodization process may be provided by selectively forming the doped semiconductor layer 7 in specific regions of a semiconductor substrate. For example, a doped region, i.e., doped semiconductor layer 7, may be formed in a semiconductor substrate using ion implantation. The composition of the semiconductor substrate that is suitable for localized anozidation processes have been described above for the description of the semiconductor layer 6. In some embodiments, a block mask may be employed to select the regions of the substrate in which the doped semiconductor layer 7 is formed. The block mask may be composed of a photoresist material. The portions of the substrate that are covered by the block mask are protected from being implanted, while the portions of the substrate that are exposed by the block mask are implanted to provide the doped semiconductor layer 7. In one example, a block mask is produced by applying a photoresist to the surface to be etched, exposing the photoresist to a pattern of radiation, and then developing the pattern into the photoresist utilizing a resist developer. As will be described in more detail hereafter, the doped semiconductor layer 7 may be removed selectively to the semiconductor substrate and the later described undoped silicon germanium layer 8.

The undoped silicon germanium layer 8 may be formed atop the doped semiconductor layer 7. The undoped silicon germanium layer 8 may have a similar base composition to the doped semiconductor layer 7. For example, the base composition for the undoped silicon germanium layer 8 may be silicon germanium, in which the germanium content of the undoped silicon germanium layer 8 may range from 1 wt. % to 99 wt. %. In another embodiment, the undoped silicon germanium layer 8 can be composed of 10 wt. % to 50 wt. %. The undoped silicon germanium layer 8 may be a single layer having a continuous distribution of germanium, or it may be a graded layer having a varying content of germanium included within different regions of the layer. The thickness of the undoped silicon germanium layer 8 may range from 1 nm to 1000 nm. In another embodiment, the undoped silicon germanium layer 8 may have a thickness that ranges from 10 nm to 100 nm. Similar to the doped semiconductor layer 7, the undoped silicon germanium layer 8 may be an epitaxial material that is formed using an epitaxial deposition process. Therefore, the above description of the epitaxial deposition process that is used to form the doped semiconductor layer 7 is suitable to describe the epitaxial deposition process for forming the undoped silicon germanium layer 8.

The term "undoped" as used herein to describe the undoped silicon germanium layer 8 means that the silicon germanium layer 8 is substantially free of the dopants that are present in the doped semiconductor layer 7 that provide for the selective removal of the doped semiconductor layer 7 by anodization relative to the undoped silicon germanium layer 8 and the semiconductor layer 6. Examples of the dopants that provide for selective anodization of the doped semiconductor layer 7 have been described above. By "substantially free" it is meant that the dopants that provide for the selective anodization of the doped semiconductor layer 7 can not be present in the undoped silicon germanium layer 8 in an amount that is greater than 1 wt. %. In another embodiment, the dopants that provide for the selective anodization of the doped semiconductor layer 7 can not be present in the undoped silicon germanium layer 8 in an amount that is greater than 0.5 wt. %. In yet another embodiment, the dopants that provide for the selective anodization of the doped semiconductor layer 7 can not be present in the undoped silicon germanium layer 8.

Still referring to FIG. 1, in one embodiment, a blanket layer of a hard mask dielectric material 9 may be present on the undoped silicon germanium layer 8. The blanket layer of hard mask dielectric material 9 may be deposited over the undoped silicon germanium layer 8 prior to the formation of the photoresist mask. The blanket layer of hard mask dielectric material 9 may be composed of a nitride or oxide, and may be referred to as a fin dielectric cap after being patterned and etched.

Figure 2:
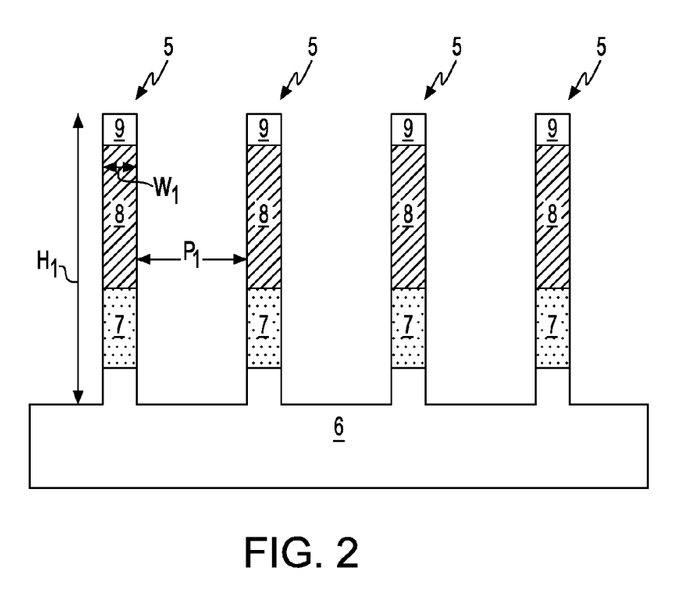
FIG. 2 is a side cross-sectional view of one embodiment of forming fin structures from the material stack that is depicted in FIG. 1.

FIG. 2 depicts forming fin structures 5 from the material stack 10 and the blanket layer of hard mask dielectric material blanket layer 9. The hard mask dielectric material 9, and a two stage anisotropic etch may be utilized to transfer the pattern from the photoresist mask into the undoped silicon germanium layer 8, the doped semiconductor layer 7 and the semiconductor layer 6 to provide the fin structures 5. In one embodiment, an etch mask may be formed on the blanket layer of hard mask dielectric material 9 by a blanket layer of photoresist material that is formed utilizing for example, spin-on coating. The blanket layer of photoresist material can then be patterned to provide the photoresist mask utilizing a lithographic process that may include exposing the photoresist material to a pattern of radiation and developing the exposed photoresist material utilizing a resist developer. Following the formation of the photoresist mask, the two stage anisotropic etch may be conducted, in which a first selective etch removes the exposed portions of the blanket layer of hard mask dielectric material 9, wherein the photoresist mask protects the portion of the hard mask dielectric layer 9 that is present beneath the photoresist mask to provide the dielectric fin cap for each of the fin structures 5. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater.

The undoped silicon germanium layer 8 that is beneath the protected remaining portions of the blanket layer of hard mask dielectric material 9 provides the fin structures 5 of the subsequently formed device. In a second stage of the two stage anisotropic etch, the exposed portions of the undoped silicon germanium layer 8 and the doped semiconductor layer 7 are removed by an etch chemistry that removes the material of the material stack 10 selectively to the remaining portions of the blanket layer of hard mask dielectric material 9. During the second stage of the etch process, the remaining portions of the blanket layer of hard mask dielectric material 9 function as an etch mask that protects the underlying portion of the material stack 10 to provide the fin structures 5 from the undoped silicon germanium layer 8 and the doped semiconductor layer 7. The etch process for forming the fin structures 5 may be an anisotropic etch. An anisotropic etch process is a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present invention include ion beam etching, plasma etching or laser ablation.

Each of the fin structures 5 may have a height $H_1$ ranging from 5 nm to 200 nm. In one embodiment, each of the fin structures 5 may have height $H_1$ ranging from 10 nm to 100 nm. In another embodiment, each of the fin structures 5 may have a height $H_1$ ranging from 15 nm to 50 nm. Each of the fin structures 5 may have a width $W_1$ ranging from 5 nm to 50 nm. In another embodiment, each of the fin structures 5 may have width $W_1$ ranging from 8 nm to 20 nm. Adjacent fin structures 5 may be separated by a pitch P1 ranging from 20 nm to 100 nm. In one embodiment, adjacent fin structures 5 may be separated by a pitch P1 ranging from 30 nm to 50 nm.

Figure 3A:
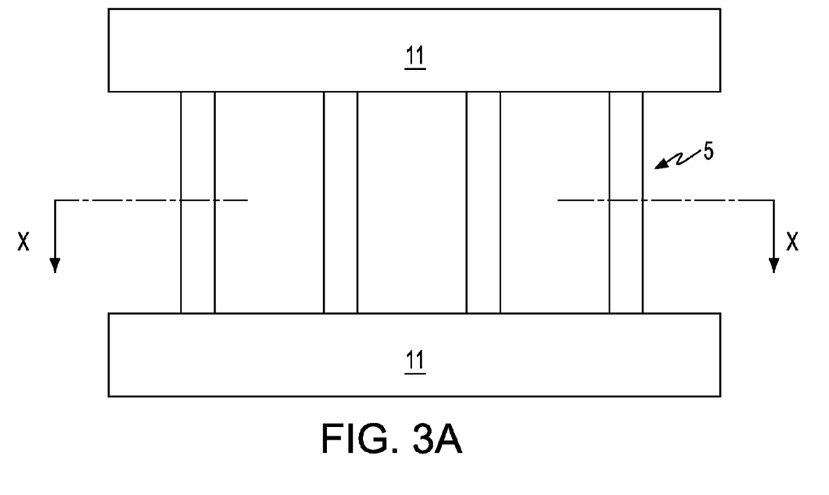
FIG. 3A is a side cross-sectional view of forming a supporting structure in contact with at least one end of the at least one fin structure, in accordance with one embodiment of the present disclosure.
Figure 3B:
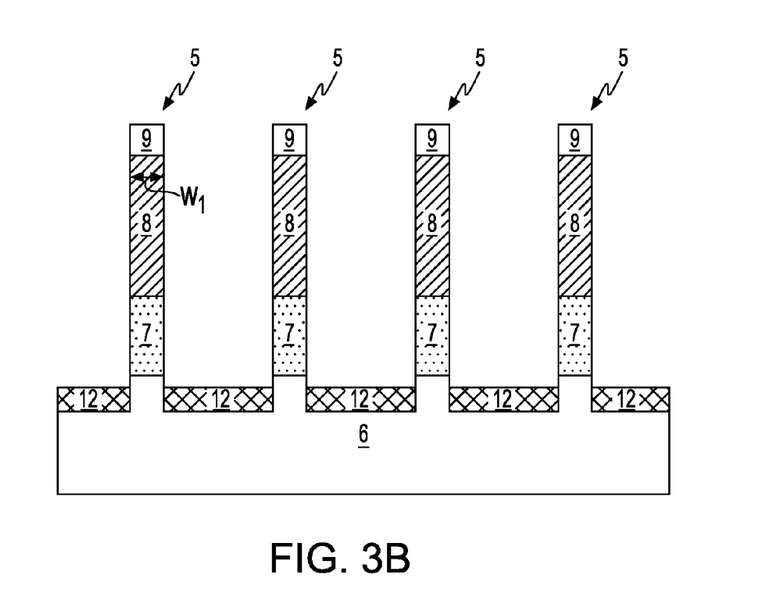
FIG. 3B is a side cross-sectional view along section line A-A of the structure depicted in FIG. 3A.

FIGS. 3A and 3B depict forming a supporting structure 11 in contact with at least one end of the at least one fin structure 5. The supporting structure 11 is a material that will support the undoped silicon germanium layer 8 after the doped semiconductor layer 7 is removed using the subsequently described anodization process. Therefore, the supporting structure 11 must be composed of a dielectric material that will not be removed by the anodization process. For example, the supporting structure 11 can be composed of an oxide, such as silicon oxide ($SiO_2$), a nitride, such as silicon nitride, or a silicon oxynitride. Because the supporting structure 11 is composed of a dielectric material, the supporting structure 11 may in some embodiments, be referred to as an isolation region. For example, the supporting structure 11 that is in contact with the ends of the fin structures 5 may be a deep trench isolation region, and a shallow trench isolation region 12 may be present between the deep trench isolation region that provides the supporting structure 11. The shallow trench isolation region 12 may be present between adjacent fin structures 5. Other structures may also be used as the supporting structure. For example, dummy gate may be formed on top and sidewalls of fins before anodization and serves as the supporting structure.

In one embodiment, forming the supporting structure 11 comprises depositing a dielectric material filling the trenches separating the adjacent fin structures 5. The dielectric material may be deposited using CVD, evaporation, chemical solution deposition, spin on deposition, and PVD methods. Following deposition, the dielectric material at the ends of the fin structures 5 may be protected by an etch mask, while the portion of the dielectric material that is not underlying the etch mask is recessed by an etch process, such as an anisotropic etch, e.g., reactive ion etch (RIE). Following etch, the portion of the dielectric material that is protected by the etch mask provides the supporting structure 11 that is in contact with and is engaged to the ends of the fin structures 5.

Figure 4:
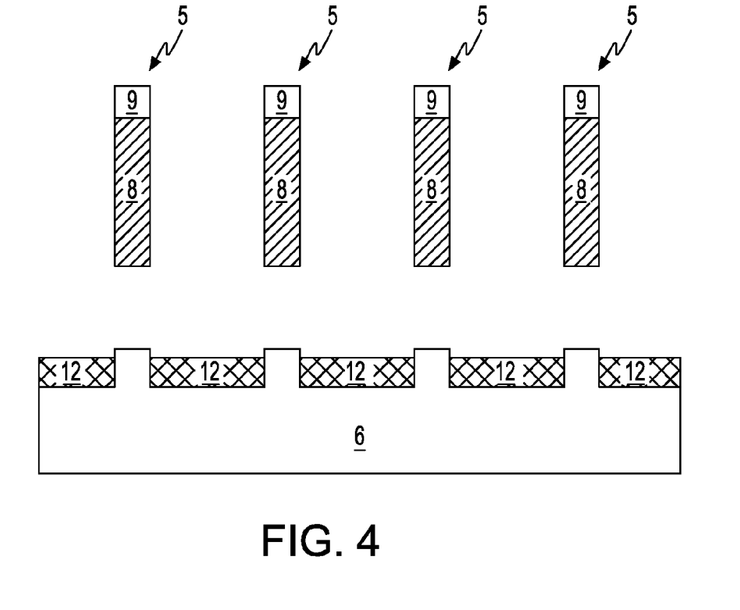
FIG. 4 is a side cross-sectional view depicting one embodiment of an anodization process for removing the doped semiconductor layer of the at least one fin structure.

FIG. 4 depicts one embodiment of an anodization process to remove the doped semiconductor layer 7 of the at least one fin structure 5 to provide a void between the semiconductor layer 6 and the undoped silicon germanium layer 8. In FIG. 4, the undoped silicon germanium layer 8 is not floating, but is supported by the supporting structure 11. In some embodiments, the anodization process removes the doped semiconductor layer 7 selectively to at least the undoped silicon germanium layer 8, the semiconductor layer 6, and supporting structure 11. In one embodiment, the doped semiconductor layer 7 is doped with boron (B), the semiconductor layer 6 is composed of silicon (Si) and the supporting structure 11 is composed of silicon oxide ($SiO_2$). One example of an anodization process that removes the doped semiconductor layer 7, e.g., boron doped semiconductor layer, is performed by immersing the structure shown in FIG. 3 into an HF-containing solution while an electrical bias is applied to the structure with respect to an electrode also placed in the HF-containing solution. In such a process, the structure typically serves as the positive electrode of the electrochemical cell, while another semiconducting material, such as Si, or a metal is employed as the negative electrode. In general, the HF anodization dissolves the doped silicon germanium layer 7. The rate of removal may depend upon material properties, i.e., doping type and concentration, as well as the reaction conditions of the anodization process itself (current density, bias, illumination and additives in the HF-containing solution). The term "HF-containing solution" includes concentrated HF (49%), a mixture of HF and water, a mixture of HF and a monohydric alcohol, such as methanol, ethanol, propanol, etc, or HF mixed with at least one surfactant. The amount of surfactant that is present in the HF solution is typically from 1% to 50%, based on 49% HF.

In one embodiment, the anodization process is performed using a constant current source that operates at a current density from 0.05 milliAmps/cm$^2$ to 50 milliAmps/cm$^2$. A light source may be optionally used to illuminate the sample. In another embodiment, the anodization process employed uses a constant current source operating at a current density from 0.1 milliAmps/cm$^2$ to 5 milliAmps/cm$^2$. The anodization process is typically performed at room temperature, or a temperature that is elevated from room temperature or below room temperature may be used. For example, the temperature of the anodization process may range from 0 degree Celsius to 80 degree. Following the anodization process, the structure is typically rinsed with deionized water and dried. Anodization typically occurs for a time period of less than about 10 minutes, with a time period of less than 1 minute being more typical.

Figure 5:
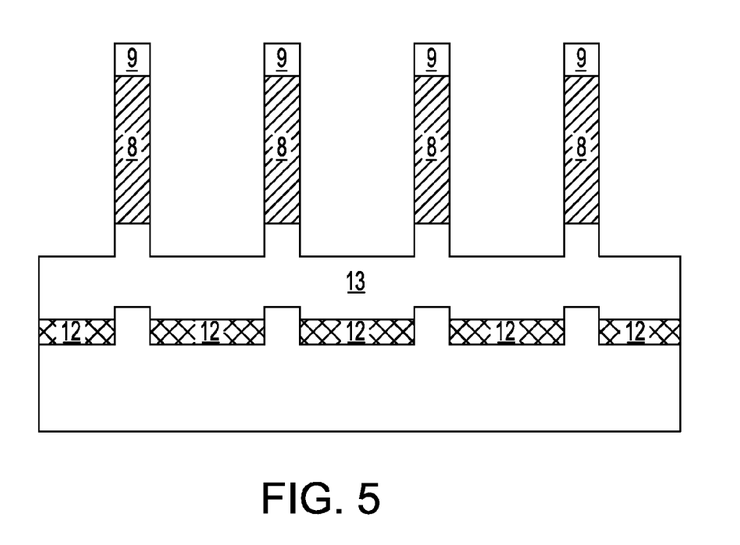
FIG. 5 is a side cross-sectional view depicting a dielectric layer that is deposited to fill the void that is present between the silicon layer and the undoped silicon germanium layer, in accordance with one embodiment of the present disclosure.

FIG. 5 depicts one embodiment of a dielectric layer 13 that is deposited to fill the void that is present between the semiconductor layer 6 and the doped semiconductor layer 8. Dielectric layer 13 may comprise a same or different dielectric material as supporting structure 11. In one embodiment, the dielectric layer 13 is an oxide, e.g., $SiO_2$, nitride or oxynitride material. It is noted that the above examples of dielectric materials is provided for illustrative purposes only, and it is not intended that the dielectric layer 13 be limited to only those materials. For example, the dielectric layer 13 may be selected from the group consisting of silicon-containing materials, such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC), amorphous hydrogenated carbon ($\alpha$-C:H), or silicon boron nitride (SiBN). The dielectric layer 13 may be deposited using at least one of spinning from solution, spraying from solution, chemical vapor deposition (CVD), plasma enhanced CVD (PECVD), atomic layer deposition (ALD), sputter deposition, reactive sputter deposition, ion-beam deposition, and evaporation.

FIGS. 6A-6D depict forming source and drain regions 15 to the fin structures 5. In some embodiments, the process sequence for forming the source and drain regions 15 to the fin structures 5 includes forming a gate structure 14 on a channel portion of the fin structures 5; forming a spacer 18 on a sidewall of the fin structures 5; and forming the source and drain regions 15 on opposing sides of the gate structure 14. This process sequence may be referred to as a gate first process. FIGS. 6A-6D depict a gate first process. In another embodiment, the process sequence for forming the source and drain regions 15 to the fin structures 5 includes a gate last process sequence, which is not depicted in the supplied figures. A gate last process includes forming a replacement gate structure on the channel portion of the fin structure, forming a spacer on the sidewall of the replacement gate structure, forming source and drain regions on opposing sides of the replacement gate structure, removing the replacement gate structure, and forming a functional gate structure in the space once occupied by the replacement gate structure. The replacement gate structure can include sacrificial material that defines the geometry of a later formed functional gate structure that functions to switch the semiconductor device from an "on" to "off" state, and vice versa. A process sequence employing a replacement gate structure may be referred to as a gate last process sequence. Although the following description for forming the source and drain regions 15 depicted in FIGS. 6A-6D is a gate first process sequence, both gate first and gate last process sequences are applicable to the present disclosure.

A gate structure 14 may be formed on a channel portion of the fin structures 5. The gate structure 14 may include at least one gate dielectric 16 and at least one gate conductor 17. The at least one gate dielectric 16 of the gate structure 14 may be composed of any dielectric material including oxides, nitrides and oxynitrides. In one embodiment, the at least one gate dielectric 16 may be provided by a high-k dielectric material. The term "high-k" as used to describe the material of the at least one gate dielectric 16 denotes a dielectric material having a dielectric constant greater than silicon oxide ($SiO_2$) at room temperature (20° C. to 25° C.) and atmospheric pressure (1 atm). For example, a high-k dielectric material may have a dielectric constant greater than 4.0. In another example, the high-k gate dielectric material has a dielectric constant greater than 7.0. In one embodiment, the at least one gate dielectric 16 is composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the at least one gate dielectric 16 include hafnium silicate, hafnium silicon oxynitride or combinations thereof. In one embodiment, the at least one gate dielectric 16 may be deposited by chemical vapor deposition (CVD). Variations of CVD processes suitable for depositing the at least one gate dielectric 16 include, but are not limited to, APCVD, LPCVD, PECVD, MOCVD, ALD, and combinations thereof. In one embodiment, the thickness of the at least one gate dielectric 16 is greater than 0.8 nm. More typically, the at least one gate dielectric 16 has a thickness ranging from about 1.0 nm to about 6.0 nm.

The at least one gate conductor 17 is formed on the at least one gate dielectric 16. The at least one gate conductor 17 may be formed by a deposition process, such as CVD, plasma-assisted CVD, plating, and/or sputtering, followed by planarization. In one embodiment, the at least one gate conductor 17 is composed of metal or a doped semiconductor. Examples of metals that may be employed for the at least one gate conductor 17 may include, but is not limited to, W, Ni, Ti, Mo, Ta, Cu, Pt, Ag, Au, Ru, Ir, Rh, and Re, Al, TiN, WN, TaN, TiAlN, TaAlN, and alloys thereof. One example of a doped semiconductor that is suitable for the at least one gate conductor 17 is doped polysilicon.

The at least one gate structure 14 may be formed using deposition, photolithography and etch processes. The at least one gate structure 14 is formed on a channel portion of the at least one fin structure 5. For example, the material layers for the at least one gate dielectric 16 and the at least one gate electrode 17 may be deposited onto the fin structures 5 to provide a gate stack. Thereafter, the gate stack may be patterned and etched to provide the gate structures 14. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections of the sacrificial material covered by the photoresist are protected to provide the gate structures 14, while the exposed regions are removed using a selective etching process that removes the unprotected regions. Following formation of the gate structures 14, the photoresist may be removed. In some embodiments, dielectric fin caps, i.e., the hard mask dielectric layer 9, can be removed from the fin structures 5 prior to forming the at least one gate structure 14. In one embodiment of the present disclosure, at least one spacer 18 is formed adjacent to the at least one gate structure 14. In some embodiments, at least one spacer 18 may be formed in direct contact with the at least one gate structure 14. The at least one spacer 18 may be composed of a dielectric material, such as an oxide, nitride or oxynitride material. In one embodiment, the at least one spacer 18 may be formed by using a blanket layer deposition, such as chemical vapor deposition, and an anisotropic etch-back method. In one embodiment, the at least one spacer 18 may have a width ranging from 1 nm to 10 nm. In another embodiment, the at least one spacer 18 my have a width that ranges from 1 nm to 5 nm.

In some embodiments and after the formation of the at least one spacer 18, the source and drain regions 15 may be formed in contact with the fin structures 5 on opposing sides of the channel region. In some embodiments, the source and drain regions 15 include a source and drain extension region and a raised source and drain region. The source and the drain extension regions may formed in the exposed portions of the fin structures 15 that are present on opposing sides of gate structure 14, which may be referred to as the source and drain portions of the fin structures 5. In some embodiments, the source and drain extension regions are formed using in situ doping, an ion implantation process, plasma doping, gas phase diffusion, diffusion from a doped oxide or a combination thereof.

The conductivity type of the source region and drain extension regions typically dictates the conductivity type of the semiconductor device. As used herein, "p-type" refers to the addition of impurities to an intrinsic semiconductor that creates deficiencies of valence electrons. In a silicon-containing material, examples of p-type dopants, i.e., impurities, include but are not limited to, boron, aluminum, gallium and indium. As used herein, "n-type" refers to the addition of impurities that contributes free electrons to an intrinsic semiconductor. In a silicon containing material examples of n-type dopants, i.e., impurities, include but are not limited to antimony, arsenic and phosphorous.

After forming the source and drain extension regions, raised source and drain regions may be formed on the portions of the fin structures 5 that contain the source and drain extension regions. The raised source and drain regions may have the same conductivity type as their corresponding source and drain extension regions. The source and drain extension regions are typically formed using an epitaxial deposition process. The dopant that dictates the conductivity type of the raised source and drain regions may be introduced in-situ or may be introduced using ion implantation.

FIGS. 6A-6D depict one embodiment of a semiconductor device that includes a bulk semiconductor substrate 6 (also referred to as a semiconductor layer 6), a dielectric layer 13 present on a surface of the bulk semiconductor substrate 6, and a silicon germanium (SiGe) fin structure 5 that is in direct contact with the dielectric layer 13. Source and drain regions 15 having a p-type conductivity are in direct contact with a channel portion of the silicon germanium (SiGe) fin structure 5.

FIGS. 7-10 depict another embodiment of the present disclosure. FIGS. 7-10 depict one embodiment of a method of forming a semiconductor device that is a complementary metal oxide semiconductor (CMOS) device. CMOS devices typically include at least one p-type semiconductor device and at least one n-type semiconductor device that are on the same semiconductor substrate.

Figure 7:
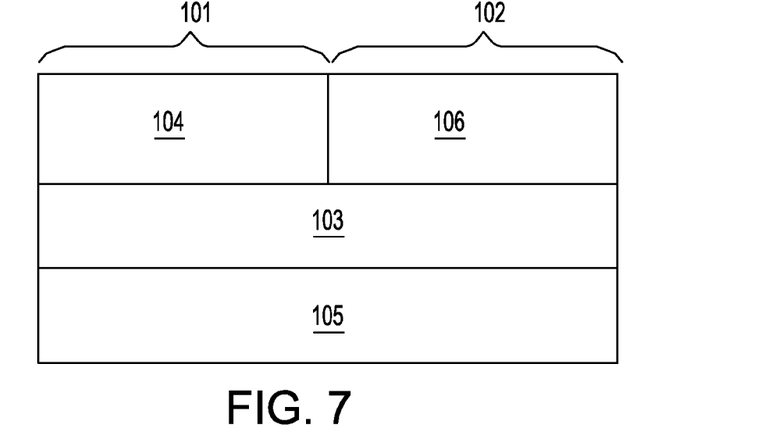
FIG. 7 is a side cross-sectional view depicting a first material stack of a silicon layer on a doped semiconductor layer and a second material stack of silicon germanium on a doped semiconductor layer, wherein the first material stack and the second material stack are present on a semiconductor substrate, in accordance with another embodiment of the present disclosure.

Referring to FIG. 7, the method may begin with forming a first material stack 101 and a second material stack 102 on a substrate 105. The first material stack 101 includes a doped semiconductor layer 103 that is present on the substrate 105, and a silicon layer 104 that is present on the doped semiconductor layer 103. The second material stack 102 includes the doped semiconductor layer 103 that is present on the substrate 105 and a silicon germanium layer 106 that is present on the doped semiconductor layer 103. The substrate 105 is similar to the semiconductor layer 6 that is described above with reference to FIG. 1. Therefore, the description of the semiconductor layer 6 is suitable for the substrate 105. For example, the substrate 105 may be a silicon containing material, such as silicon. The doped semiconductor layer 103 is similar to the doped semiconductor layer 7 that is depicted in FIG. 1. For example, the doped semiconductor layer 103 may be composed of silicon germanium and may be doped with boron at a concentration ranging from $1 \times 10^{17}$ atoms/cm$^3$ to $5 \times 10^{20}$ atoms/cm$^3$. The silicon layer 104 of the first material stack 101 is composed of a silicon-containing layer, such as silicon, single crystal silicon, polycrystalline silicon, silicon doped with carbon (Si:C) or a combination thereof. The silicon layer 104 may be formed using an epitaxial deposition process. The silicon germanium layer 106 is similar to the undoped silicon germanium layer 8 that is depicted in FIG. 1. Therefore, the description of the undoped silicon germanium layer 8 that is depicted in FIG. 1 is suitable for the silicon germanium layer 106 that is depicted in FIG. 7. For example, the silicon germanium layer 106 may be "substantially free" of the dopants that provide for the later described selective anodization of the doped semiconductor layer 103. In one example, when the doped semiconductor layer 103 is doped with boron, boron content of the silicon germanium layer 16 can not be greater than 1 wt. %. In yet another example, when the doped semiconductor layer 103 is doped with boron, the silicon germanium layer 16 is completely free of boron.

Figure 8:
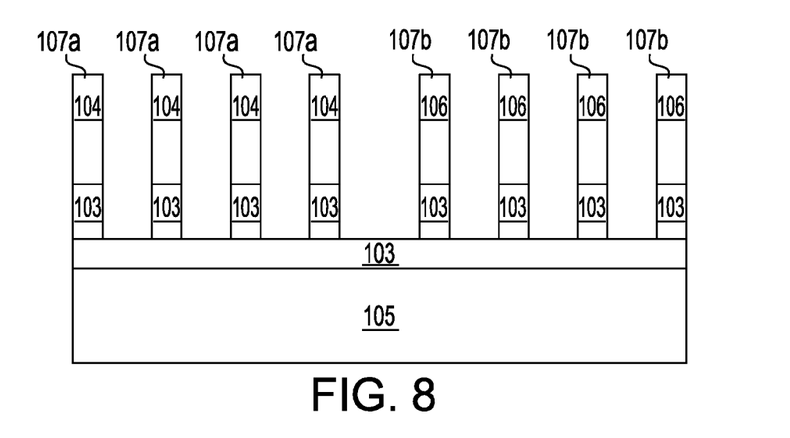
FIG. 8 is a side cross-sectional view depicting one embodiment of forming fin structures from the first material stack and the second material stack that are depicted in FIG. 7.

FIG. 8 depicting forming fin structures 107a, 107b from the first material stack 101 and the second material stack 102 that are depicted in FIG. 7. The fin structures 107a, 107b are formed using photolithography, patterning and etching processes. The method of forming the fin structures 107a, 107b that are depicted in FIG. 8 is similar to the method of forming the fin structures 5 that are depicted in FIG. 2. Therefore, the description of the fin structures 5 and the method of forming the fin structures 5 that are depicted in FIG. 2, is suitable for describing the fin structures 107a, 107b that are depicted in FIG. 8. For example, the etch process for forming the fin structures 107a, 107b etches through the entire thickness of the silicon germanium layer 106 and the silicon layer 104, and etches through a portion of the doped semiconductor layer 103.

In one embodiment, following forming the fin structures 107a, 107b, a supporting structure is formed on at least one end of the fin structures 107a, 107b. The supporting structure has been described in the description of the embodiments that are depicted in FIGS. 1-6D, in which the supporting structure is identified by reference number 11.

Figure 9:
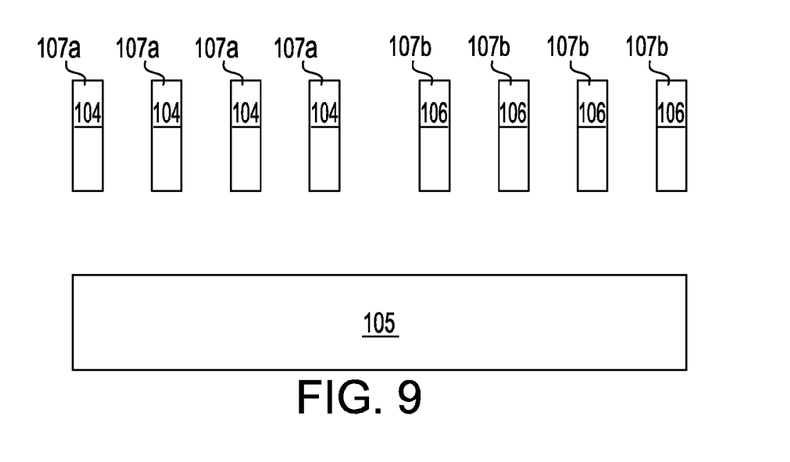
FIG. 9 is a side cross-sectional view depicting removing the doped semiconductor layer to provide a void between the substrate and the silicon layer and the substrate and the silicon germanium layer, in accordance with one embodiment of the present disclosure.

FIG. 9 depicts one embodiment of removing the doped semiconductor layer 103 to provide a void between the substrate 105 and the silicon layer 104 of the fin structures 107a produced from the first material stack, and the substrate 105 and the silicon germanium layer 106 of the fin structures 107b produced from the second material stack. In some embodiments, the doped semiconductor layer 103 is removed by an anozidation process that removes the doped semiconductor layer 103, e.g., boron doped semiconductor layer, but does not remove the silicon material of the substrate 105 and the silicon layer 104, and does not remove the silicon germanium layer 106, e.g., silicon germanium layer 106 that is free of boron dopant. The anodization process that is depicted in FIG. 9 is similar to the anodization process that is depicted in FIG. 4. Therefore, the description of the anodization for removing the doped semiconductor layer 7 that is depicted in FIG. 4 is suitable for removing the doped semiconductor layer 103 that is depicted in FIG. 9.

Figure 10:
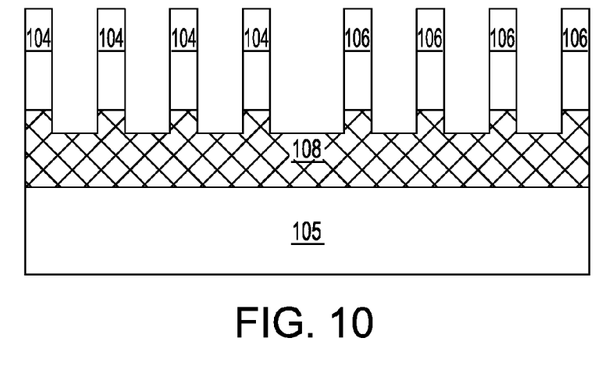
FIG. 10 is a side cross-sectional view depicting one embodiment of forming a dielectric layer to fill the void that is present between the substrate and the silicon layer and to fill the void between the substrate and the silicon germanium layer.

FIG. 10 depicts one embodiment of depositing a dielectric layer 108 to fill the void that is present between the substrate 105 and the silicon layer 104 and the void between the silicon germanium layer 106 and the substrate 105. The dielectric layer 108 that is depicted in FIG. 10 is similar to the dielectric layer 13 that is described with reference to FIG. 5. Therefore, the description of the dielectric layer 13 depicted in FIG. 5 is suitable for describing the dielectric layer 108 that is depicted in FIG. 10.

Figure 6A:
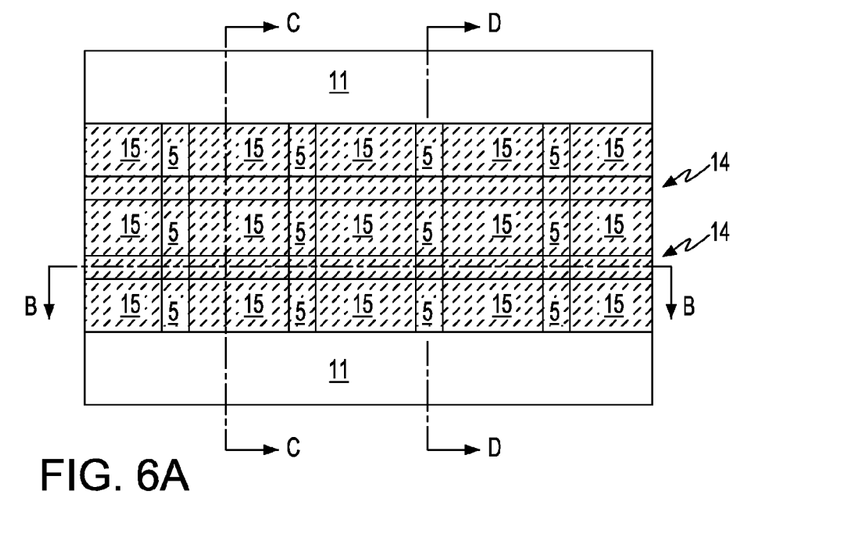
FIG. 6A is a top down view depicting forming source and drain regions to the fin structures, in accordance with one embodiment of the present disclosure.
Figure 6B:
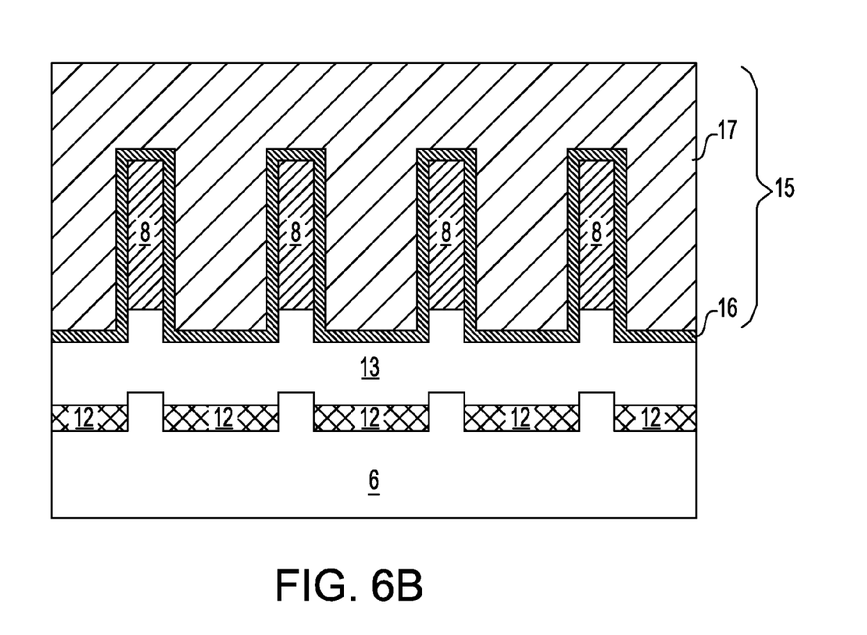
FIG. 6B is a side cross-sectional view along section line B-B in FIG. 6A.
Figure 6C:
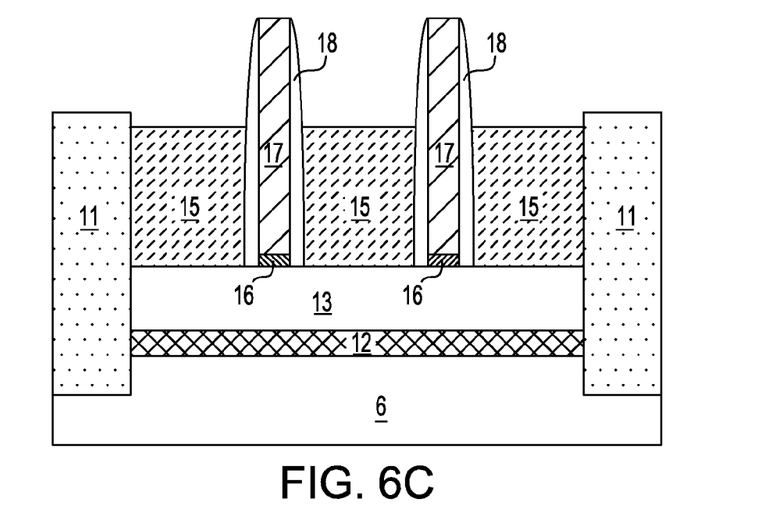
FIG. 6C is a side cross-sectional view along section line C-C in FIG. 6A.
Figure 6D:
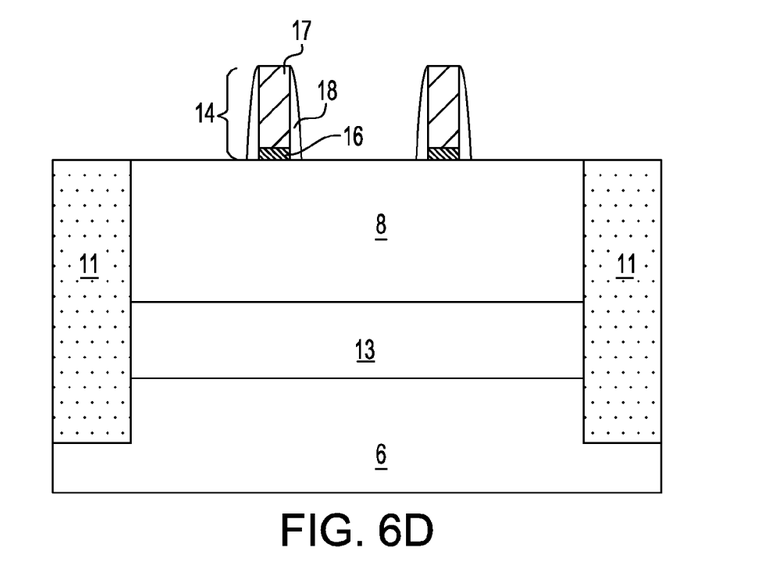
FIG. 6D is a side cross-sectional view along section line D-D in FIG. 6A.

A gate structure may than be formed on the channel portion of each of the fin structures 107a, 107b. A description of the gate structure suitable for use with the fin structures 107a, 107b depicted in FIG. 10 can be provided by the gate structure 14 that is depicted in FIGS. 6A-6D. Following the formation of the gate structure, source and drain regions are formed on each of the fin structures 107a, 107b on opposing sides of the gate structure. The source and drain regions may each include source and drain extension regions and raised source and drain regions. The source and drain regions of the fin structures 107a including the silicon layer 104 are typically doped to provide an n-type conductivity. The source and drain regions of the fin structures 107b including the silicon germanium layer 106 are typically doped to provide a p-type conductivity. Block masks may be employed to protect one set of the fin structures 107a, 107b while implanting a second set of the fin structures 107a, 107b. The block mask may be a patterned photoresist layers. Further details regarding the types of dopants that provide the n-type and p-type conductivity are described above when describing forming the source and drain regions 15 of the semiconductor devices that are depicted in FIGS. 6A-6C.

Figure 11:
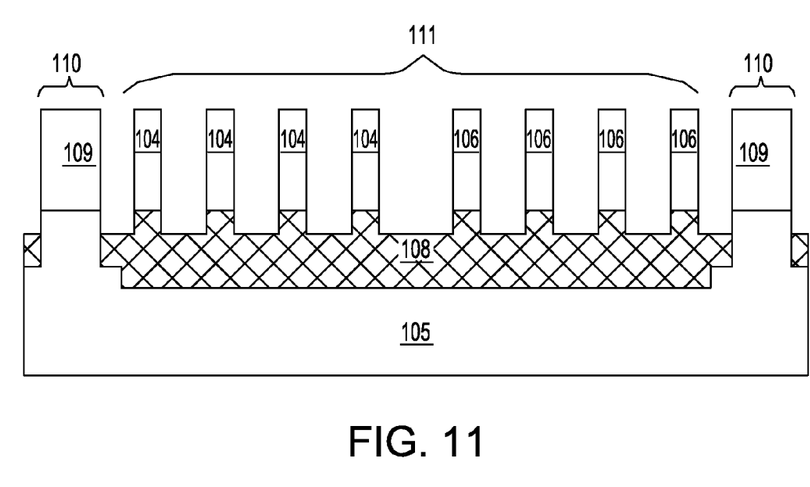
FIG. 11 is a side cross-sectional view depicting one embodiment of a semiconductor structure that has been treated with a localized anodization process, in accordance with one embodiment of the present disclosure.

FIG. 11 depicts one embodiment of a CMOS semiconductor structure that was subjected to a localized anodization process. The portions 110 of the semiconductor substrate 105 that were not subjected to the anodization process provide fin structures 109 for high current applications, such as electrostatic discharge (ESD) device. The fin structures 109 for the high current applications are in communication with the semiconductor substrate 105, in which the semiconductor substrate 105 provides a heat sink. In some embodiments, the fin structures 109 that have not been subjected to an anozidation process, and are in direct contact with the semiconductor substrate 5, are subjected to a current density that ranges from 1 mA/μm to 3 mA/μm, and the fin structures 104, 106 that are in direct contact with the dielectric layer 108 are subjected to a current density that ranges from 0.1 mA/μm to 2 mA/μm. Although the fin structures 109 that are in direct contact with the semiconductor substrate 105 are depicted as having a width that is greater than the fin structures 104, 106 that are present in contact with the dielectric layer 108, the present disclosure is not limited to only this embodiment. Embodiments have been contemplated in which the width of the fin structures 109 that are in direct contact with the semiconductor substrate 105 have the same width as the fin structures 104, 106 that are present in contact with the dielectric layer 108. In some embodiments, the fin structure 109 may comprise the same material as the fin structure 104. In some embodiments, the fin structure 109 may comprise the same material as the fin structure 106. In some embodiments, the fin structure 109 may comprise multiple fins wherein some fins have the same material as the fin structure 104 and others have the same material as the fin structure 106. The fin structure 109 to the semiconductor substrate 105, e.g., bulk semiconductor substrate, may be referred to as a contact fin structure.

While the present disclosure has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a semiconductor device comprising:
   providing a material stack that includes, from bottom to top, of a semiconductor layer, a doped semiconductor layer that is present on a surface of the semiconductor layer, and an undoped silicon germanium layer that is present on the doped semiconductor layer;
   forming at least one fin structure from the material stack by etching completely through the undoped silicon germanium layer, completely through the doped semiconductor layer, and only partially through the semiconductor layer, wherein the at least one fin structure is located on a non-etched portion of the semiconductor layer and comprises, from bottom to top, a semiconductor layer portion, a doped semiconductor layer portion, and a doped silicon germanium layer portion, wherein sidewall surfaces of the semiconductor layer portion, the doped semiconductor layer portion, and the doped silicon germanium layer portion are vertically coincident with each other;
   forming a supporting material in contact with at least a portion of at least one fin structure;
   removing the doped semiconductor layer portion of the at least one fin structure with an anodization process to provide a void between the semiconductor layer portion and the undoped silicon germanium layer portion;
   depositing a dielectric layer to fill the void that is present between the semiconductor layer portion and the undoped silicon germanium layer portion; and
   forming a source region and a drain region on a channel portion of the at least one fin structure.

2. The method of claim 1, wherein the providing of the material stack comprises:
   epitaxially forming the doped semiconductor layer on a bulk semiconductor substrate; and
   epitaxially forming the undoped silicon germanium layer on the doped semiconductor layer.

3. The method of claim 2, wherein the doped semiconductor layer is in situ doped during epitaxially forming of a base material for the doped semiconductor layer.

4. The method of claim 1, wherein the doped semiconductor layer is doped with boron, indium and a combination thereof.

5. The method of claim 1, wherein a concentration of the dopant in the doped semiconductor layer range from $5\times10^{17}$ atoms/cm$^3$ to $5\times10^{19}$ atoms/cm$^3$.

6. The method of claim 1, wherein the forming of the at least one fin structure from the material stack comprises:
   forming an etch mask on the undoped silicon germanium layer; and
   etching exposed portions of the undoped silicon germanium layer and the doped semiconductor layer selectively to the semiconductor layer.

7. The method of claim 1, wherein the forming of the supporting material that is in contact with said at least one end of the at least one fin structure comprises depositing a dielectric material on the at least one fin structure; and recessing portions of the dielectric material that are present between ends of the at least one fin structure, wherein portions of the dielectric material at the ends of the at least one fin structure have a width greater than portions of the dielectric material that are recessed and present between the ends of the at least one fin structure.

8. The method of claim 1, wherein the removing the doped semiconductor layer portion of the at least one fin structure with the anodization process to provide the void between the semiconductor layer portion and the undoped silicon germanium layer portion comprises:

immersing the at least one fin structure in an HF-containing solution; and applying an electrical bias to the at least one fin structure that is immersed in the HF-containing solution.

9. The method of claim 8, wherein the anodization process further comprises:

placing an electrode in the HF-containing solution, wherein the electrode is the negative electrode and the at least one fin structure is the positive electrode.

10. The method of claim 1, wherein the depositing the dielectric layer to fill the void that is present between the semiconductor layer portion and the undoped silicon germanium layer portion comprises an oxide, nitride or oxynitride layer that is deposited by chemical vapor deposition, evaporation, chemical solution deposition, spin on deposition and combinations thereof.

11. The method of claim 1, wherein the source region and the drain region have a p-type conductivity.

12. A method of fabricating a semiconductor device comprising:

forming a first material stack and a second material stack on a semiconductor substrate, wherein the first material stack includes a first portion of a doped semiconductor layer that is present on the semiconductor substrate and a silicon layer that is present on the first portion of the doped semiconductor layer, and the second material stack includes a second portion of the doped semiconductor layer that is present on the semiconductor substrate and laterally adjacent and in direct contact with a sidewall of the first portion of the doped semiconductor layer, and a silicon germanium layer that is present on the doped semiconductor layer, wherein a sidewall edge of the silicon layer is in direct physical contact with a sidewall edge of the silicon germanium layer;

forming fin structures from the first material stack and the second material stack with an etch through the silicon layer and the silicon germanium layer that terminates on the doped semiconductor layer;

forming a supporting structure on at least one end of each of the fin structures;

removing the doped semiconductor layer to provide a void between the substrate and the silicon layer and the substrate and the silicon germanium layer;

depositing a dielectric layer to fill the void that is present between the silicon layer and the substrate and the void between the silicon germanium and the substrate; and forming a source region and a drain region on a channel portion of the fin structures, wherein the source and drain regions to the fin structures including the silicon germanium layer have a p-type conductivity and the source and drain regions to the fin structures having the silicon layer have an n-type conductivity.

13. The method of claim 12, wherein the doped semiconductor layer comprises silicon germanium.

14. The method of claim 13, wherein the doped semiconductor layer is doped with a dopant selected from the group consisting of boron (B), indium (In), and a combination thereof.

15. The method of claim 14, wherein the dopant that is present in the doped semiconductor layer is present at a concentration ranging from $5\times10^{17}$ atoms/cm$^3$ to $5\times10^{19}$ atoms/cm$^3$.

16. The method of claim 12, wherein the removing of the doped semiconductor layer to provide the void between the substrate and the silicon layer and the substrate and the silicon germanium layer comprises immersing the fin structures in an HF-containing solution; and applying an electrical bias to the at fin structures that is immersed in the HF-containing solution.

* * * * *